(12) United States Patent
Matsumura et al.

(10) Patent No.: US 8,982,571 B2
(45) Date of Patent: Mar. 17, 2015

(54) ELECTRONIC EQUIPMENT WITH ELECTRIC WIRING

(71) Applicant: Panasonic Corporation, Kadoma-shi, Osaka (JP)

(72) Inventors: Reiji Matsumura, Osaka (JP); Takeshi Mori, Osaka (JP); Masato Murakata, Hyogo (JP); Kenichi Shindo, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/056,349

(22) Filed: Oct. 17, 2013

(65) Prior Publication Data

US 2014/0043781 A1 Feb. 13, 2014

Related U.S. Application Data

(63) Continuation of application No. 13/034,882, filed on Feb. 25, 2011, now Pat. No. 8,587,961.

(30) Foreign Application Priority Data

Mar. 3, 2010 (JP) ................................ 2010-046799
Mar. 10, 2010 (JP) ................................ 2010-053321

(51) Int. Cl.
*H05K 5/00* (2006.01)
*H05K 7/02* (2006.01)
*H02G 3/00* (2006.01)
*H05K 5/06* (2006.01)

(52) U.S. Cl.
CPC .. *H05K 7/02* (2013.01); *H02G 3/00* (2013.01); *H05K 5/00* (2013.01); *H05K 5/06* (2013.01)
USPC ............................ 361/752; 361/809; 361/810

(58) Field of Classification Search
USPC .......... 361/755, 825, 826, 807, 809, 810, 752
See application file for complete search history.

(56) References Cited

U.S. PATENT DOCUMENTS

| | | | |
|---|---|---|---|
| 4,289,924 A | 9/1981 | Pearce et al. | |
| 4,705,244 A | 11/1987 | Saotome et al. | |
| 5,097,529 A | 3/1992 | Cobb et al. | |
| 5,456,791 A | 10/1995 | Ueno | |
| 5,586,909 A | 12/1996 | Saba | |
| 5,703,325 A | 12/1997 | Yamaguchi et al. | |
| 5,861,120 A | 1/1999 | Yagi et al. | |
| 6,096,259 A | 8/2000 | Takahashi et al. | |
| 6,196,873 B1 | 3/2001 | Murakami et al. | |
| 6,225,562 B1 | 5/2001 | Fujishita et al. | |

(Continued)

FOREIGN PATENT DOCUMENTS

| | | |
|---|---|---|
| EP | 0 655 802 | 5/1995 |
| JP | 57-161282 U | 10/1982 |

(Continued)

*Primary Examiner* — Hung S Bui
(74) *Attorney, Agent, or Firm* — Hamre, Schumann, Mueller & Larson, P.C.

(57) ABSTRACT

Electronic equipment includes a first water cutoff member and a second water cutoff member on the periphery of a hole communicating from outside with a space in which an electric component such as an electric circuit board is provided. This can prevent liquid, dust, and the like, which enter a first housing from outside, from entering the space. Thus, the electric component, etc. placed in the space can be prevented from being damaged due to an electric short-circuit.

8 Claims, 12 Drawing Sheets

(56) References Cited

U.S. PATENT DOCUMENTS

| | | |
|---|---|---|
| 6,262,824 B1 | 7/2001 | Sasaki et al. |
| 6,376,773 B1 | 4/2002 | Maegawa |
| 6,456,499 B1 | 9/2002 | Nakajima et al. |
| 7,030,320 B2 | 4/2006 | Asakura et al. |
| 7,564,412 B2 * | 7/2009 | Walker et al. ............... 343/702 |
| 7,915,544 B1 * | 3/2011 | Ayres, III et al. ............ 174/564 |
| 8,003,898 B2 * | 8/2011 | Hayashi et al. .............. 174/385 |
| 8,106,312 B2 * | 1/2012 | Shinoda et al. .............. 174/554 |
| 8,154,681 B2 * | 4/2012 | Yamaguchi et al. ........... 349/60 |
| 8,236,405 B2 * | 8/2012 | Ren .............................. 428/137 |
| 8,687,353 B2 * | 4/2014 | Murakata ................. 361/679.24 |
| 2004/0157481 A1 * | 8/2004 | Watanabe .................... 439/165 |
| 2009/0284424 A1 * | 11/2009 | Yoon et al. ................... 343/702 |
| 2012/0097681 A1 | 4/2012 | Lin et al. |

FOREIGN PATENT DOCUMENTS

| | | |
|---|---|---|
| JP | 1-143182 U | 10/1989 |
| JP | 7-240253 | 9/1995 |
| JP | 9-460066 | 2/1997 |
| JP | 2806406 | 7/1998 |
| JP | 11-354199 | 12/1999 |
| JP | 2004-319267 | 11/2004 |
| JP | 2006-032733 | 2/2006 |
| JP | 2007-225635 | 9/2007 |
| JP | 2009-170603 | 7/2009 |

* cited by examiner

ELECTRONIC EQUIPMENT WITH ELECTRIC WIRING

BACKGROUND OF THE INVENTION

1. Field of the Invention

The present application relates to electronic equipment with electric wiring.

2. Description of Related Art

In recent years, mobile devices such as a notebook computer with enhanced waterproof, dripproof, and dustproof performance have made their debut on the assumption that they are used outdoors. Of those mobile devices, a mobile device with a plurality of housings such as a notebook computer or a foldable mobile telephone is required to have a configuration in which electric components housed respectively in the plurality of housings are connected to each other electrically. In the case of a notebook computer, for example, it is necessary that a liquid crystal display housed in one housing be connected electrically to an electric circuit board housed in the other housing. For such electric connection between the electric components, leads, flat lead cables, etc. are used frequently. In the case of connecting the electric components to each other via leads and the like, it is necessary to provide holes respectively in the plurality of housings so as to extract the leads therethrough, which degrades waterproof performance, etc.

JP 2004-319267 A discloses a configuration in which pressure blades pass through insulating coating portions arranged in a plane direction of a flat electric wire to fix the flat electric wire, and a waterproof member is crimped onto the flat electric wire from above and below the flat electric wire.

As disclosed by JP 2004-319267 A, with a configuration in which the flat electric wire is placed on the waterproof member, intervals between a plurality of electric wires constituting the flat electric wire become non-uniform in most cases, and the waterproof member is not placed between the electric wires precisely in a portion where the interval between the electric wires is small, which makes the waterproofness insufficient. In such a configuration, a waterproof gasket is not placed precisely between conductive cables in a portion where the interval between the conductive cables is extremely small, which makes the waterproofness insufficient.

SUMMARY

Electronic equipment of the present application includes: an electric component; a conductive cable electrically connected to the electric component; and a cable holding member having a pair of holding portions capable of holding the conductive cable.

DETAILED DESCRIPTION OF THE EMBODIMENTS

Embodiment 1

[1. Configuration of Electronic Equipment]

Figure 1:
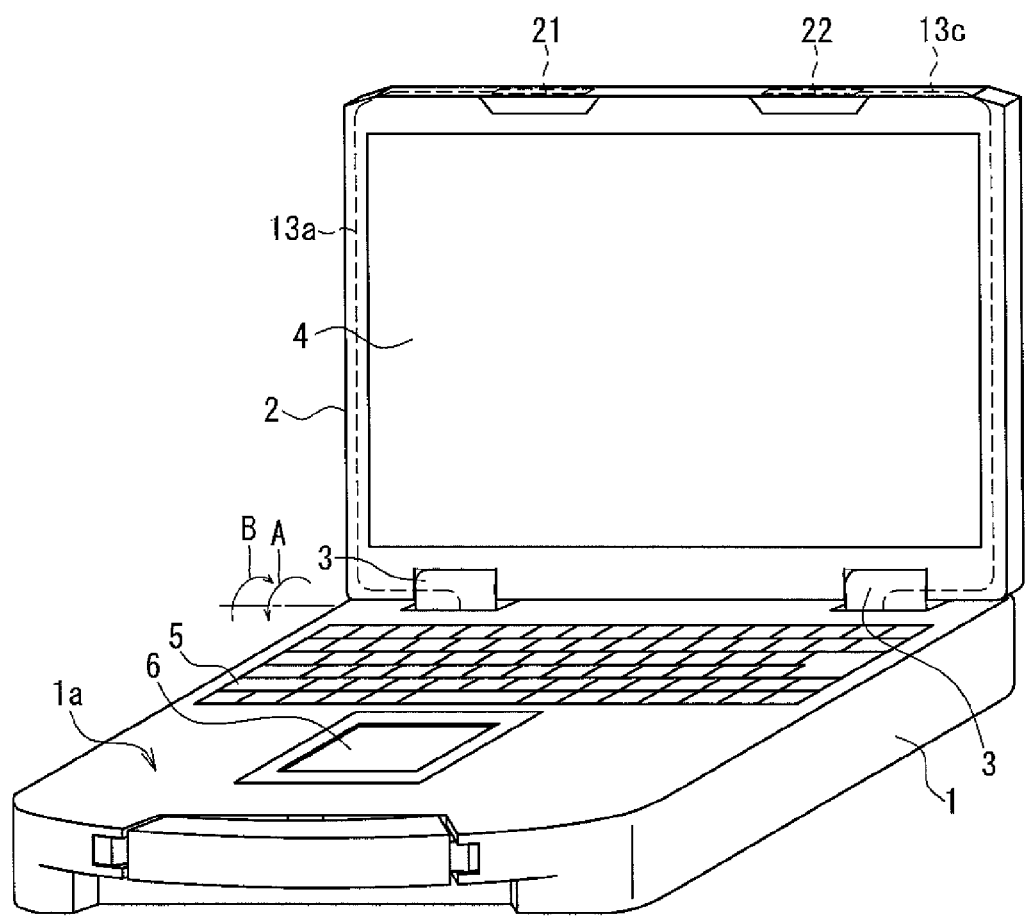
FIG. 1 is a perspective view of a notebook computer in Embodiment 1.

FIG. 1 is a perspective view illustrating an outer appearance of a notebook computer as an example of electronic equipment according to Embodiment 1. In the present embodiment, although a notebook computer is exemplified as the electronic equipment, any equipment may be used as long as it includes a plurality of housings and has a configuration in which electric components housed in the respective housings are connected to each other electrically. Further, although the notebook computer illustrated in FIG. 1 has a handle that can be held by a user's hand, the handle can be omitted.

As illustrated in FIG. 1, the notebook computer includes a first housing 1 and a second housing 2. The first housing 1 contains a circuit board on which various electric elements are mounted, a hard disk drive, and the like. The second housing 2 includes a display panel 4. The display panel 4 is, for example, a liquid crystal display. The first housing 1 and the second housing 2 are supported with respect to each other rotatably by hinge portions 3. The hinge portions 3 have shafts supporting the first housing 1 and the second housing 2 rotatably in a direction of an arrow A or B. A keyboard 5 and a pointing device 6 are placed on an upper surface 1a of the first housing 1. The second housing 2 includes a first communication portion 21 and a second communication portion 22.

The first communication portion 21 and the second communication portion 22 are capable of transmitting an electromagnetic wave outside and receiving an electromagnetic wave transmitted from outside. The first communication portion 21 includes, for example, an antenna corresponding to a wireless Local Area Network (LAN), a transmitting circuit, and a receiving circuit. The second communication portion 22 includes, for example, an antenna corresponding to a Wide Area Network (WAN), a transmitting circuit, and a receiving circuit. One end of a first conductive cable 13a is connected electrically to the first communication portion 21. The first conductive cable 13a is placed in the second housing 2, the hinge portion 3, and the first housing 1. The other end of the first conductive cable 13a is connected electrically to an electric circuit board (not shown) housed in the first housing 1. One end of a third conductive cable 13c is connected electrically to the second communication portion 22. The third conductive cable 13c is placed in the second housing 2, the hinge portion 3, and the first housing 1. The other end of the third conductive cable 13c is connected electrically to the electric circuit board housed in the first housing 1. The type of an electromagnetic wave which the first communication portion 21 and the second communication portion 22 illustrated in FIG. 1 are capable of transmitting/receiving, and the set positions thereof are merely examples. Further, in FIG. 1, the first conductive cable 13a and the third conductive cable 13c are illustrated schematically.

Figure 2:
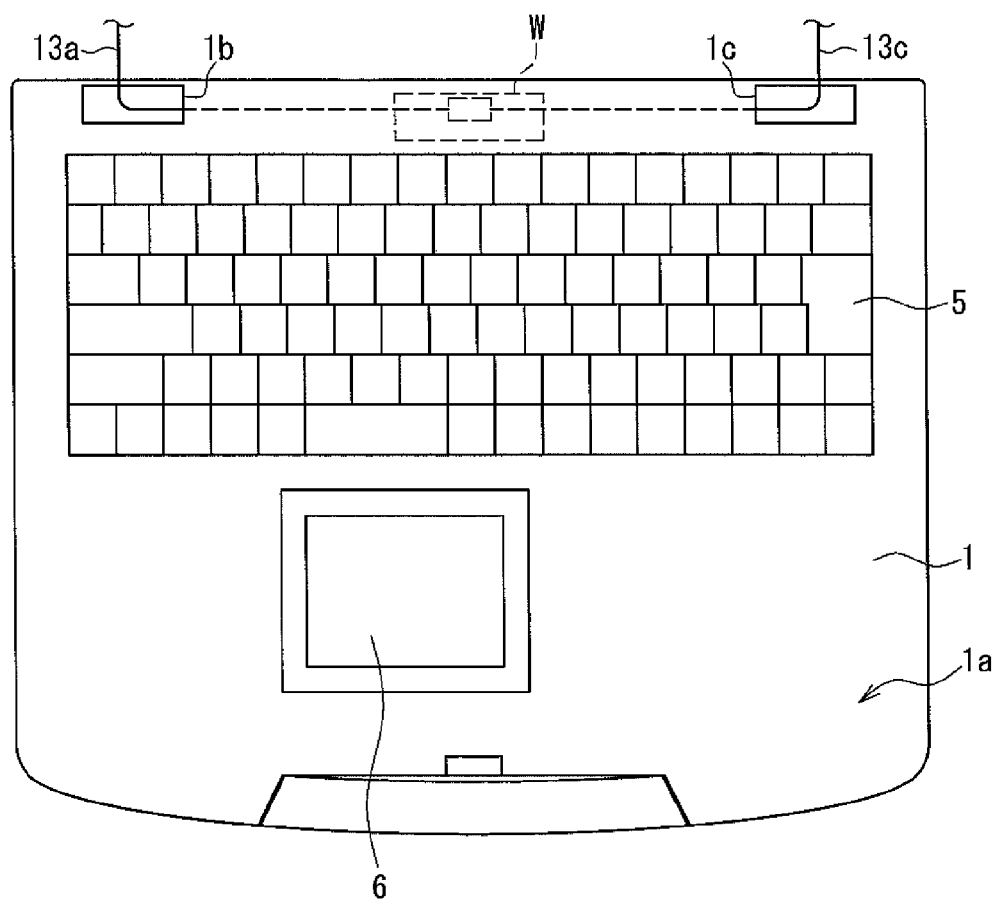
FIG. 2 is a plan view of a first housing.

FIG. 2 is a plan view of the upper surface 1a of the first housing 1. As illustrated in FIG. 2, the first conductive cable 13a and the third conductive cable 13c are connected to the electric circuit board via a water cutoff area W in the first housing 1. The water cutoff area W is provided with a water cutoff portion. Although FIG. 2 illustrates only the first conductive cable 13a and the third conductive cable 13c, actually, other conductive cables also are provided.

An inner space of the first housing 1 is separated mainly into two spaces. One space of the first housing 1 contains components having conductivity such as the electric circuit board. Further, the first housing 1 includes a hole 1b for extracting the first conductive cable 13a and the like from the first housing 1 and a hole 1b for extracting the third conductive cable 13c and the like from the first housing 1 in the vicinity of the hinge portions 3. Thus, liquid, dust, and the like may enter the first housing 1 through the holes 1b and 1c. The holes 1b and 1c are connected spatially to the other space of the two spaces in the first housing 1. The other space of the first housing 1 and one space of the first housing 1 are connected spatially to each other with the water cutoff area W (water cutoff portion) interposed therebetween. Thus, although liquid and the like having entered the first housing 1 through the holes 1b and 1c in the housing 1 enter the other space, the liquid and the like do not enter the one space due to the water cutoff portion.

[2. Water Cutoff Structure of Water Cutoff area W]

Figure 3:
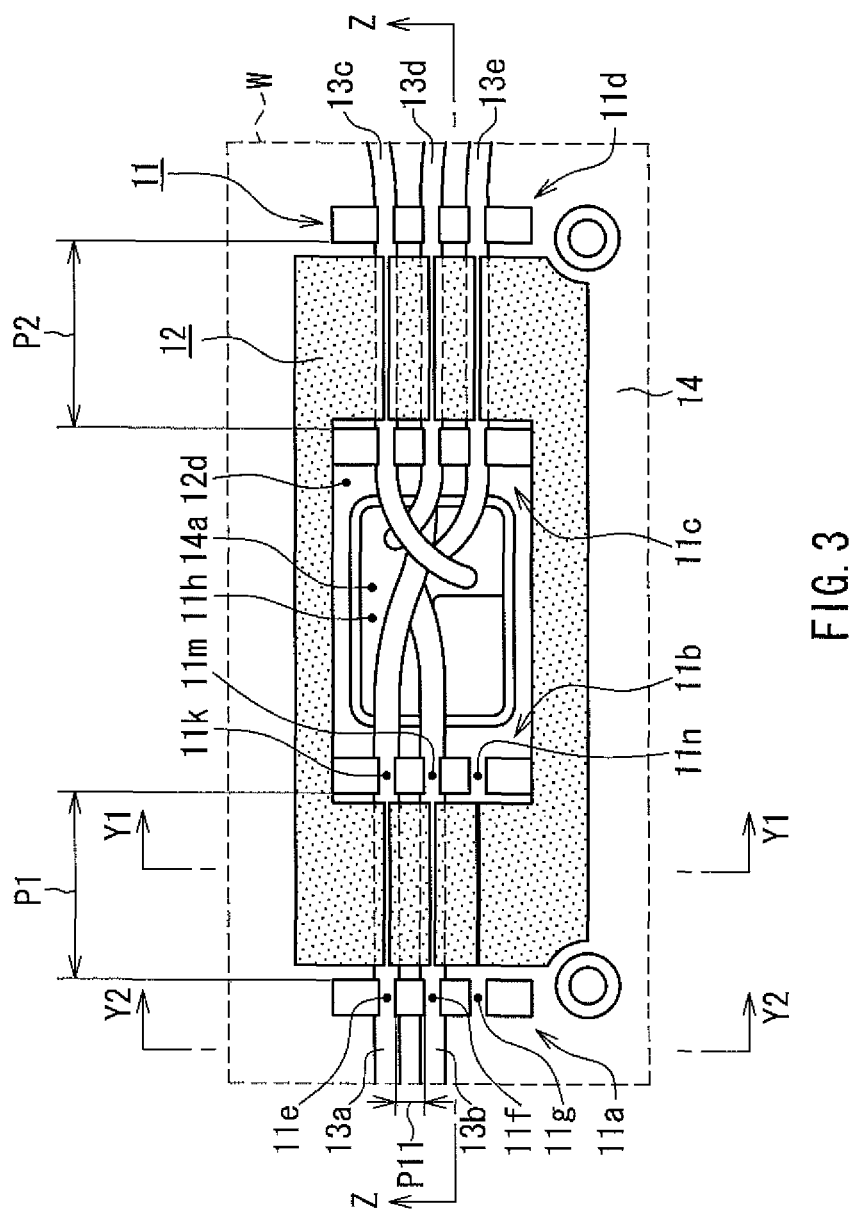
FIG. 3 is a plan view of a water cutoff portion.
Figure 4:
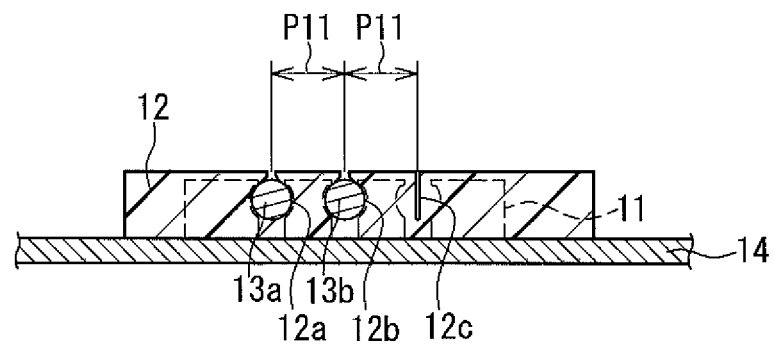
FIG. 4 is a cross-sectional view taken along a Y1-Y1 portion of FIG. 3.
Figure 5:
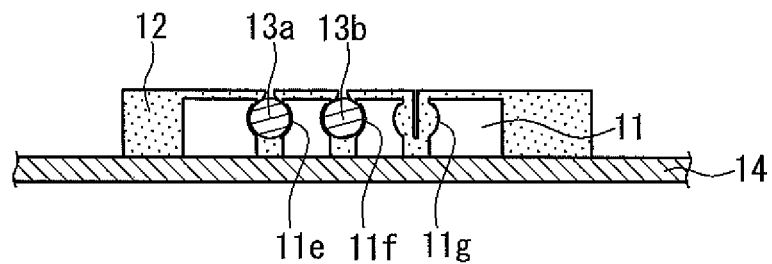
FIG. 5 is a cross-sectional view taken along a Y2-Y2 portion of FIG. 3.
Figure 6:
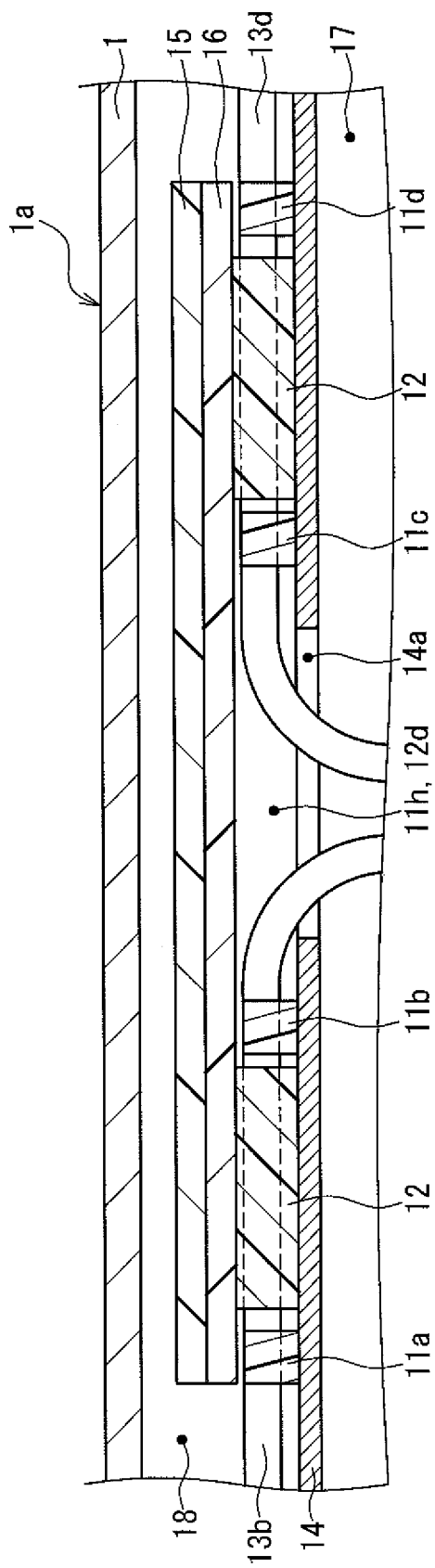
FIG. 6 is a cross-sectional view taken along a Z-Z portion of FIG. 3.

FIG. 3 is a plan view of the water cutoff area W (water cutoff portion) provided in the first housing 1. FIG. 4 is a cross-sectional view taken along a Y1-Y1 portion of FIG. 3. FIG. 5 is a cross-sectional view taken along a Y2-Y2 portion of FIG. 3. FIG. 6 is a cross-sectional view taken along a Z-Z portion of FIG. 3.

The water cutoff area W includes a cable holder 11, a first water cutoff member 12, a covering 15, and a second water cutoff member 16. As illustrated in FIG. 4, etc., the first water cutoff member 12 adheres to a frame 14 with an adhesive or the like having waterproofness. The frame 14 is provided integrally in the first housing 1. The frame 14 is placed between a first space 17 and a second space 18 inside the first housing 1. In the first space 17, an electric circuit board and the like are placed. The second space 18 is communicating with an outer space.

The cable holder 11 is capable of holding conductive cables 13a to 13e. The cable holder 11 adheres to a principal plane of the frame 14 with an adhesive or the like having waterproofness. It is preferred that the cable holder 11 may be provided integrally on the frame 14, since this configuration can enhance waterproofness. The cable holder 11 has a hole 11h at a position substantially matched with a hole 14a formed in the frame 14. The cable holder 11 preferably is formed of a flexible material. It is preferred that the cable holder 11 is formed of, for example, soft resin capable of being deformed elastically. As the soft resin capable of being deformed elastically, for example, polybutylene terphthalate resin, nitrile rubber, or silicone rubber can be used. The cable holder 11 has a first holder portion 11a, a second holder portion 11b, a third holder portion 11c, and a fourth holder portion 11d.

The first holder portion 11a and the second holder portion 11b are opposed to each other with a gap accommodating a part of the first water cutoff member 12 interposed therebetween. The third holder portion 11c and the fourth holder portion 11d are opposed to each other with a gap accommodating a part of the first water cutoff member 12 interposed therebetween. The second holder portion 11b and the third holder portion 11c are opposed to each other with the hole 11h interposed therebetween. The holder portions 11a to 11d respectively have slit-shaped holding portions for holding conductive cables, and for the purpose of clarity, only the holding portions provided at the first and second holder portions 11a and 11b are denoted with reference numerals. The first holder portion 11a has holding portions 11e, 11f, and 11g. The second holder portion 11b has holding portions 11k, 11m, and 11n. The holding portions 11e and 11k are provided at positions opposed to each other. The holding portions 11f and 11m are provided at positions opposed to each other. The holding portions 11g and 11n are provided at positions opposed to each other. The pitch between the holding portions 11e and 11f, and the pitch between the holding portions 11k and 11m have the same size P11. The pitch between the holding portions 11f and 11g, and the pitch between the holding portions 11m and 11n have the same size. The third holder portion 11c and the fourth holder portion 11d have holding portions similar to the holding portions 11e to 11n. Further, the size relationship of the holding portions provided respectively in the third holder portion 11c and the fourth holder portion 11d is similar to that of the holding portions 11e to 11n.

The first water cutoff member 12 has a rectangular solid shape. As illustrated in FIG. 3, a hole 12d is formed so as to pass through the first water cutoff member 12. The inner diameter of the hole 12d is at least larger than the sum of outer diameters of the conductive cables 13a to 13e. The first water cutoff member 12 is formed of a material having elasticity and being capable of ensuring waterproofness. The first water cutoff member 12 can be formed of, for example, a silicone foam. The first water cutoff member 12 may adhere to the frame 14 with an adhesive tape or the like, and it is preferred that the first water cutoff member 12 adheres to the frame 14 with an adhesion system having waterproofness at least for preventing liquid from entering from between the first water cutoff member 12 and the frame 14. In the first water cutoff member 12, slits 12a, 12b, and 12c are formed at a predetermined gap P11 (see FIG. 4). Although reference numerals are not denoted, slits also are formed at positions where the conductive cables 13c to 13e are placed in a portion between the third holder portion 11c and the fourth holder portion 11d in the first water cutoff member 12. The first water cutoff member 12 has elasticity, and hence, allows the conductive cables 13a to 13e to be press-fitted in the slits 12a to 12c, etc. while being deformed elastically. The slit 12a is formed on a line segment connecting the holding portion 11e to the holding portion 11k. The slit 12b is formed on a line segment connecting the holding portion 11f to the holding portion 11m. The slit 12c is formed on a line segment connecting the holding portion 11g to the holding portion 11n.

As illustrated in FIG. 6, the covering 15 can close an upper region of the cable holder 11. The second water cutoff member 16 is sandwiched between the cable holder 11 and the covering 15, and between the first water cutoff member 12 and the covering 15. The second water cutoff member 16 may be provided at least so as to abut on a portion positioned on the periphery of the hole 12d of the first water cutoff member 12. The second water cutoff member 16 is formed of a material having elasticity and being capable of ensuring waterproofness. The second water cutoff member 16 can be formed of, for example, a silicone foam. It is preferred that the second water cutoff member 16 adheres to the covering 15 with an adhesive tape or the like so that the second water cutoff member 16 becomes unlikely to be shifted from the covering 15.

As illustrated in FIG. 1, the first conductive cable 13a has one end connected to the first communication portion 21 and the other end connected to the electric circuit board housed in the first space 17 in the first housing 1. As illustrated in FIG. 1, the third conductive cable 13c has one end connected to the second communication portion 22 and the other end connected to the electric circuit board housed in the first space 17 in the first housing 17. Although not shown, the second conductive cable 13b, the fourth conductive cable 13d, and the fifth conductive cable 13e also have the one ends connected to electric components in the communication portion and the like and the other ends connected to the electric circuit board housed in the first space 17 in the first housing 1. The conductive cables 13a to 13e are wired so as to pass through the second space 18, the hole 14a, and the first space 17.

When the water cutoff portion of the present embodiment is allowed to have the conductive cables, first, as illustrated in FIGS. 3 and 5, the holding portions 11e and 11k are allowed to hold the first conductive cable 13a, and the holding portions 11f and 11m are allowed to hold the conductive cable 13b. An interval P1 between the first holder portion 11a and the second holder portion 11b is set in such a manner that a region of the first conductive cable 13a between portions held by the holding portion 11e and the holding portion 11k, and a region of the second conductive cable 13b between portions held by the holding portion 11f and the holding portion 11m are unlikely to become loose.

Next, as illustrated in FIG. 4, the region of the first conductive cable 13a between the portions held by the holding portion 11e and the holding portion 11k is buried in the slit 12a of the first water cutoff member 12. Further, the region of the second conductive cable 13b between the portions held by the holding portion 11f and the holding portion 11m is buried in the slit 12b of the first water cutoff member 12.

Since the holding portion 11e, the slit 12a, and the holding portion 11k are placed on the same line, the first conductive cable 13a is suspended linearly between the holding portion 11e and the holding portion 11k. Since the holding portion 11f, the slit 12b, and the holding portion 11m also are placed on the same line, the second conductive cable 13b is suspended linearly between the holding portion 11f and the holding portion 11m.

Further, the pitch between the holding portion 11e and the holding portion 11f, and the pitch between the holding portion 11k and the holding portion 11m have the size P11. Therefore, the first conductive cable 13a and the second conductive cable 13b are held by the first holder portion 11a and the second holder portion 11b so as to be parallel to each other with the gap having the size P11 interposed therebetween.

Further, by allowing the first holder portion 11a and the second holder portion 11b to hold the first conductive cable 13a and the second conductive cable 13b, and burying the first conductive cable 13a and the second conductive cable 13b in the first water cutoff member 12, the first water cutoff member 12 can be placed between the first conductive cable 13a and the second conductive cable 13b.

Although detailed descriptions are omitted, the third conductive cable 13c, the fourth conductive cable 13d, and the fifth conductive cable 13e also can be held by the third holder portion 11c and the fourth holder portion 11d in the same procedure as that of the above.

Next, as illustrated in FIG. 6, the second water cutoff member 16 is placed on the cable holder 11 and the first water cutoff member 12. At this time, the second water cutoff member 16 is placed so as to abut on at least the periphery of the hole 12d of the first water cutoff member 12.

Next, the covering 15 is placed on the second water cutoff member 16, and the covering 15 is fixed to the cable holder 11. The covering 15 may be fixed to the cable holder 11 by screwing or hook engagement. Further, when the covering 15 is fixed to the cable holder 11, the water cutoff is enhanced with reliability by pressing the first water cutoff member 12 and/or the second water cutoff member 16 with the covering 15 and the cable holder 11.

As described above, the water cutoff can be performed in a portion where the first water cutoff member 12 and the second water cutoff member 16 abut on each other, and liquid, dust, and the like entering from outside through the second space 18 can be prevented from entering the first space 17, in which the electric circuit board and the like are placed, through the hole 14a.

[3. Effects of Embodiment, etc.]

According to the present embodiment, due to the configuration in which the first water cutoff member 12 is placed on the periphery of the hole 14a communicating with the first space 17 from outside, and the hole 12d of the first water cutoff member 12 is closed with the second water cutoff member 16, liquid, dust, and the like, which enters from outside, can be prevented from entering the first space 17. This can prevent the electric components and the like placed in the first space 17 from being short-circuited electrically to be damaged.

Further, according to the present embodiment, a plurality of conductive cables to be suspended by the first holder portion 11a and the second holder portion 11b can be suspended so that they are parallel to each other. Therefore, the intervals between the plurality of conductive cables positioned between the first holder portion 11a and the second holder portion 11b become uniform. Further, the plurality of conductive cables to be suspended by the third holder portion 11c and the fourth holder portion 11d can be suspended so that they are parallel to each other. Therefore, the intervals of the plurality of conductive cables positioned between the third holder portion 11c and the fourth holder portion 11d become uniform. Accordingly, the first water cutoff member 12 can be interposed between the plurality of cables without fail, which can prevent liquid, dust, and the like, entering from outside, from entering the first space 17.

Further, according to the present embodiment, the first water cutoff member 12 is provided with the slits 12a to 12c in which the conductive cables can be buried, and hence, the plurality of conductive cables to be suspended by the first holder portion 11a and the second holder portion 11b can be positioned. Thus, the first water cutoff member 12 can be interposed between the plurality of conductive cables without fail, which can prevent liquid, dust, and the like, entering from outside, from entering the first space 17.

In the present embodiment, although the first water cutoff member 12 and the second water cutoff member 16 are formed of a silicone foam, any material can be used as long as it has elasticity and is capable of preventing the entrance of liquid.

Further, it is preferred that the first water cutoff member 12 and the second water cutoff member 16 are formed of an integrated material so as to ensure water cutoff properties or waterproofness.

Further, the first water cutoff member 12 and the second water cutoff member 16 may be formed of silicone rubber, nitrile rubber, or the like so as to have elasticity.

Further, in the present embodiment, the first water cutoff member 12 and the second water cutoff member 16 are not limited to the constituent element names related to the function capable of preventing the entrance of water. More specifically, the water cutoff member of the present embodiment also includes the function capable of preventing various liquids or solids other than water from entering the first space 17, irrespective of the name "water cutoff member". This means that the water cutoff member should have waterproofness and dustproofness. Thus, the water cutoff member of the present embodiment can prevent liquid, foreign matter, and the like from entering the first housing 1, and prevent, for example, the electric components from causing an electric short-circuit.

Further, in the present embodiment, although the water cutoff portion is provided in the first housing 1, the water cutoff portion also may be provided in the second housing 2.

Further, the first housing 1 in the present embodiment is an example of a housing. The conductive cables 13a to 13e in the present embodiment are examples of conductive cables. The hole 14a in the present embodiment is an example of a hole. The first water cutoff member 12 in the present embodiment is an example of a water cutoff member.

Embodiment 2

In electronic equipment, a plurality of kinds of electronic function modules having various functions are contained. The electronic function modules are connected to each other and to other electronic elements so as to exhibit desired functions. Relay cables used for connection in such electronic equipment need to be formed compactly while performing connection precisely.

Figure 14:
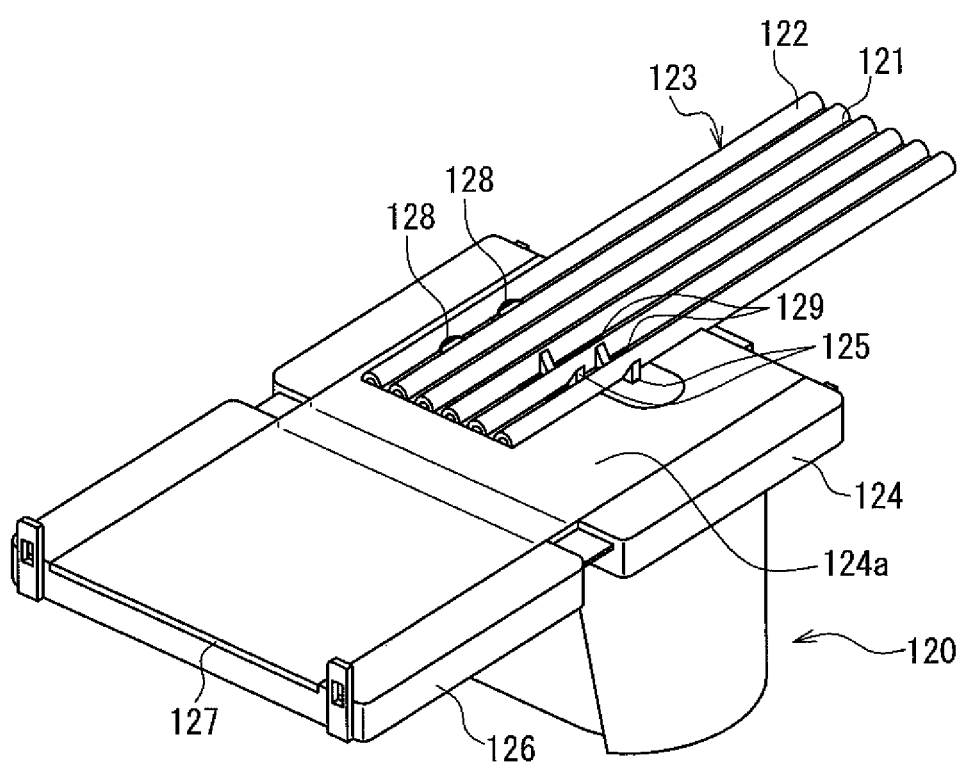
FIG. 14 is a perspective view of a configuration disclosed by JP 2004-319267 A.

For example, JP 2004-319267 A discloses a structure of a connector 120 as illustrated in FIG. 14. An end of a flat electric wire 123, in which a plurality of electric wires 122 is arranged via flat insulating coating portions 121, is connected to the connector 120. The connector 120 includes a housing 124, pressure blades 125 provided at pressure terminals (not shown), and a cover 126. The pressure blades 125 protrude from a back portion 124a of the housing 124 to be connected to the electric wires 122. The cover 126 covers the back portion 124a to sandwich the end of the flat electric wire 123 between the cover 126 and the housing 124, and thus, the end of the flat wire 123 is fixed. A waterproof member 127 in an elastic sheet shape is inserted between the back portion 124a and the cover 126. At the end of the flat electric wire 123, through-holes, with which protrusions 128 protruding from the back portion 124a of the housing 124 are engaged, are formed, and through-holes 129, with which the pressure blades 125 are engaged, are formed.

Figure 8:
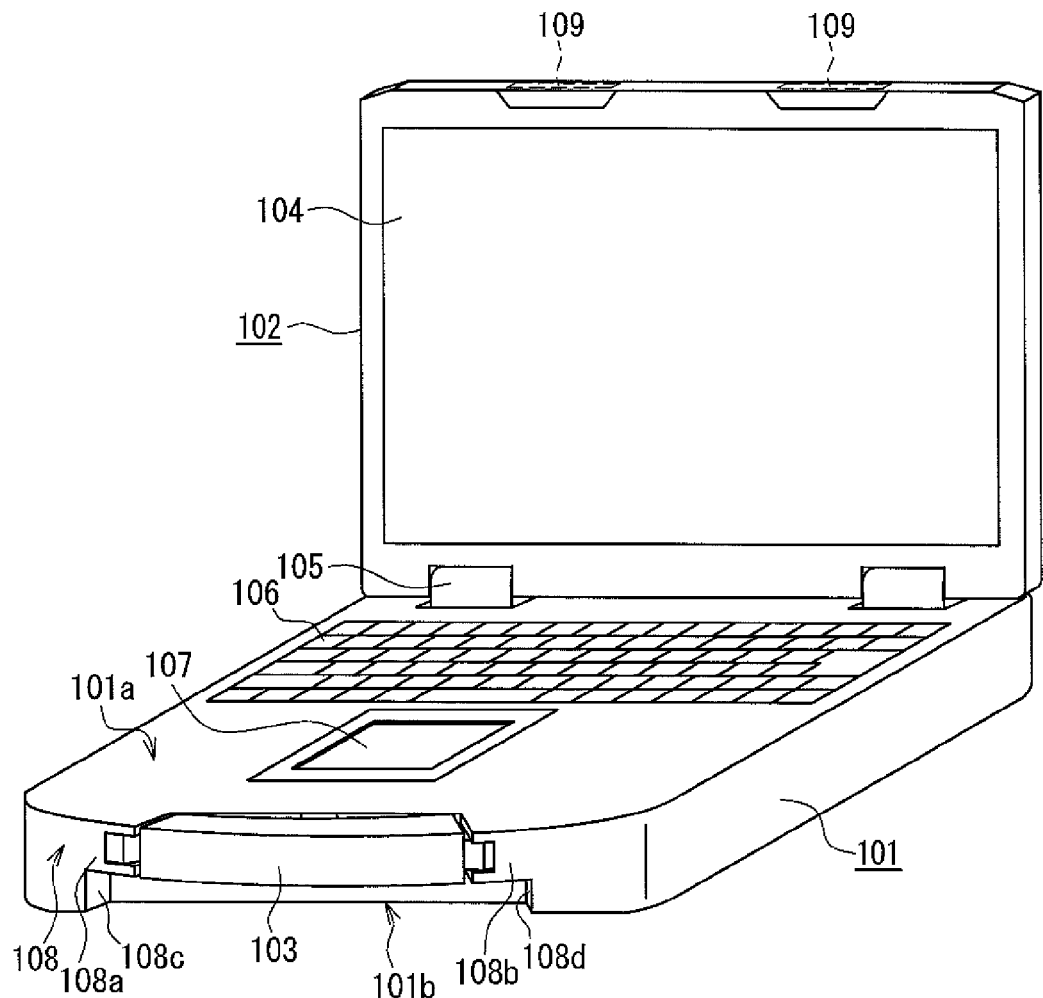
FIG. 8 is a perspective view illustrating a use state of the notebook computer.

For connecting the end of the flat electric wire 123 to the connector 120, first, the waterproof member 127 is placed across the cover 126 and the back portion 124a of the housing 124 while the cover 126 is opened as illustrated in FIG. 8. Then, the waterproof member 127 is pressed so that the protrusions 128 and the pressure blades 125 protrude through the waterproof member 127.

Next, the flat electric wire 123 is placed on the housing 124, and the protrusions 128 and the pressure blades 125 are engaged with the flat electric wire 123. When the pressure blades 125 are engaged with the through-holes 129, the electric wire 122 and the pressure terminals (not shown) are connected via the pressure blades 125.

The waterproof member 127 is folded from the cover 126 side. Then, the cover 126 is closed to cover the back portion 124a of the housing 124, thereby sandwiching the end of the flat electric wire 123 between the cover 126 and the housing 124 together with the waterproof member 126 while the folded waterproof member 127 is pressed in a thickness direction. Accordingly, the end of the flat electric wire 123 is connected to the connector 120, and the waterproofing of a connection portion between the end of the flat electric wire 123 and the connector 120 by the waterproof member 127, and the waterproofing of a tip end of the flat electric wire 123 are performed concurrently.

As described above, although JP 2004-319267 A discloses a configuration in which a plurality of electric wires can be connected compactly and precisely with a simple operation, JP 2004-319267 A does not refer to a preferred structure for wiring of relay cables connecting electronic function modules to electronic elements in the case where a plurality of kinds of electronic function modules are allowed to be connected selectively to other electronic elements.

For example, in notebook computers, a plurality of kinds of wireless communication modules for controlling the communication by Wireless Wide Area Network (WWAN), Wireless Local Area Network (WLAN), Global Positioning System (GPS), Bluetooth (registered trademark), etc., are mounted so as to be used selectively. In this case, for example, a connection terminal of an internal antenna (internal antenna terminal) and any of the communication modules are connected to each other via a relay cable.

As a use example of a relay cable in such a configuration, relay cables corresponding to the number of contained communication modules are prepared in accordance with the relay lengths between respective positions of the communication modules and the internal antenna terminal, and a relay cable for a predetermined communication module is selected for use. In this case, it is necessary to select a relay cable from the plurality of relay cables in accordance with the specification during assembly of a notebook computer or to replace a relay cable in accordance with a change in specification in some cases, which causes low assembly workability.

As another method, it also is considered to use one relay cable adjusted so as to have a length capable of connecting selectively an internal antenna terminal to a plurality of kinds of communication modules. More specifically, a relay cable is adjusted to a length reaching a communication module placed at the farthest position from the internal antenna terminal, whereby the connection between the internal antenna terminal and the plurality of kinds of communication modules is enabled with one relay cable. In this case, for connecting the internal antenna terminal to the communication module closer to the internal antenna terminal, an excess length is caused in a relay cable.

Conventionally, an excess length portion of the relay cable caused during assembly of an apparatus is folded and fixed in an appropriate excess space inside a housing of electronic equipment. However, with such handling of a relay cable, an excess length varies depending upon the difference in communication module to be connected, which leads to a case where the position at which the excess portion is placed is not constant. Therefore, noise generated due to the excess portion fluctuates along with a change in placement of the excess portion, and the noise may cause, for example, the transmission/reception characteristics with respect to an antenna to be unstable.

There also is a possibility that a relay cable comes into contact with a conductive portion in electronic equipment to cause a short-circuit, depending upon the way of handling of an excess portion of a relay cable.

Embodiment 2 has an objective of providing electronic equipment having a wiring structure capable of placing simply and stably an excess length portion of a relay cable, which occurs depending upon the difference in a target to be connected in the case of using a relay cable having a constant length.

Figure 7:
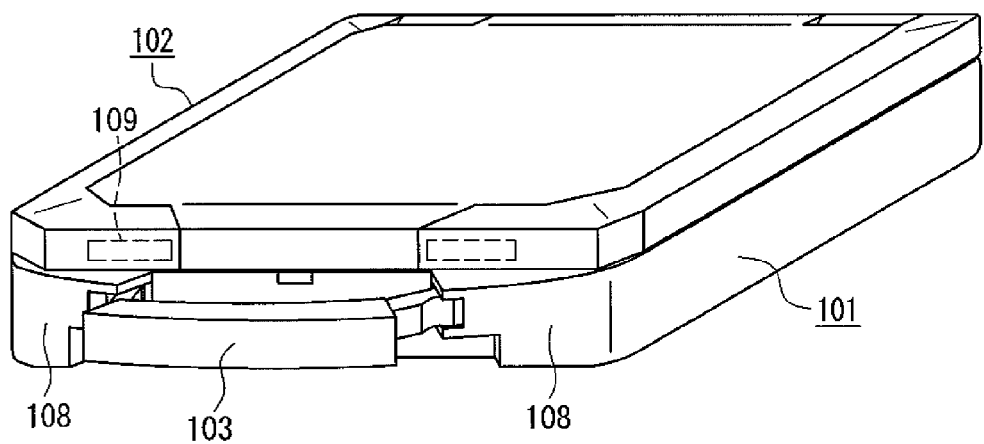
FIG. 7 is a perspective view illustrating a non-use state of a notebook computer as an example of electronic equipment in Embodiment 2.

FIG. 7 is a perspective view illustrating an outer appearance of a notebook computer as an example of electronic equipment in Embodiment 2. The notebook computer has a main housing 101, a display housing 102, and a hand grip 103. FIG. 7 illustrates a non-use state of the notebook computer. FIG. 8 is a perspective view of the notebook computer in a use state. An upper side of the main housing 101 in the state of the notebook computer illustrated in FIG. 8 is defined as a "main body top surface 101a", and a lower side thereof is defined as a "main body bottom surface 101".

The main housing 101 contains, a CPU, a circuit board on which various electric elements are mounted, a hard disk drive, a battery, and the like. The display housing 102 includes a display panel 104 for displaying an image, a character, etc. As the display panel 104, for example, a liquid crystal display 4 can be used. The main housing 101 and the display housing 102 are supported with respect to each other so as to be opened/closed by hinges 105. On the main body top surface 101a, a keyboard 106 and a pointing device 107 are placed.

The pointing device 107 is fixed in the main housing 101, and an operation surface thereof is exposed to the surface of the main body top surface 101a of the main housing 101. The main housing 101 can be molded with, for example, three-dimensional polycondensable thermosetting resin so as to maintain robustness of a notebook computer. It is desired that the main housing 101 is molded with light metal such as aluminum or magnesium, or an alloy thereof so as to realize robustness and light weight.

A pair of grip holding portions 108 are formed on one side surface of the main housing 101. The pair of grip holding portions 108 are placed at an interval and stick out form the side surface of the main housing 101 to form convex portions. The hand grip 103 is connected to the grip holding portions 108 and used for being grasped by a hand when the notebook computer is carried about. On an upper end surface of the display housing 102 in the state of FIG. 8, opposed to the hinges 105, internal antennas 109 are placed. The internal antennas 109 are configured so as to be selectively connected to communication modules (described later) via relay cables.

The grip holding portions 108 have connecting portions 108a and 108b (see FIG. 8) connected to the hand grip 103. The connecting portions 108a, 108b are formed so as to lean to the main body top surface 101a side. The connecting portion 108a of one grip holding portion 108 extends to the other grip holding portion 108, and the connecting portion 108b of one grip holding portion 108 extends to the other grip holding portion 108. The hand grip 103 and the connecting portions 108a, 108b are connected to each other so as to move with respect to each other. The hand grip 103 and the connecting portions 108a, 108b can assume a state in which the hand grip 103 is housed on the main housing 101 side as illustrated in FIG. 8, and a state in which the hand grip 103 is extracted from the main housing 101 as illustrated in FIG. 7.

Figure 9:
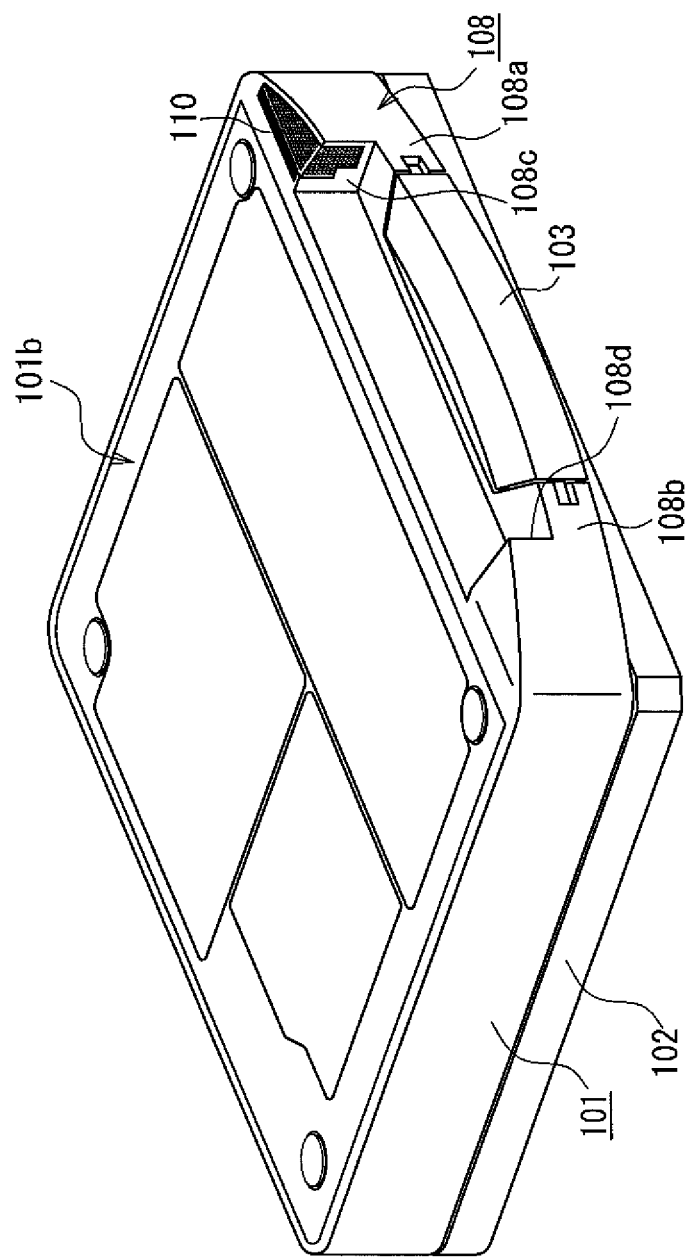
FIG. 9 is a perspective view of the notebook computer, seen from a reverse surface in the state of FIG. 7.

FIG. 9 is a perspective view illustrating the underside of the notebook computer relative to FIG. 7. In order to form a gap between the hand grip 103 and the placement surface in the state of FIG. 7, differences in level 108c and 108d are formed respectively between the main body bottom surface side of the grip holding portions 108 and the connecting portions 108a, 108b. Further, in order to provide a part of the function of a radiating unit, the grip holding portion 108 on the connecting portion 108a side is provided with an inlet port 110. The inlet port 110 is formed of, for example, punching metal, and ensures air permeability by its opening.

Figure 10:
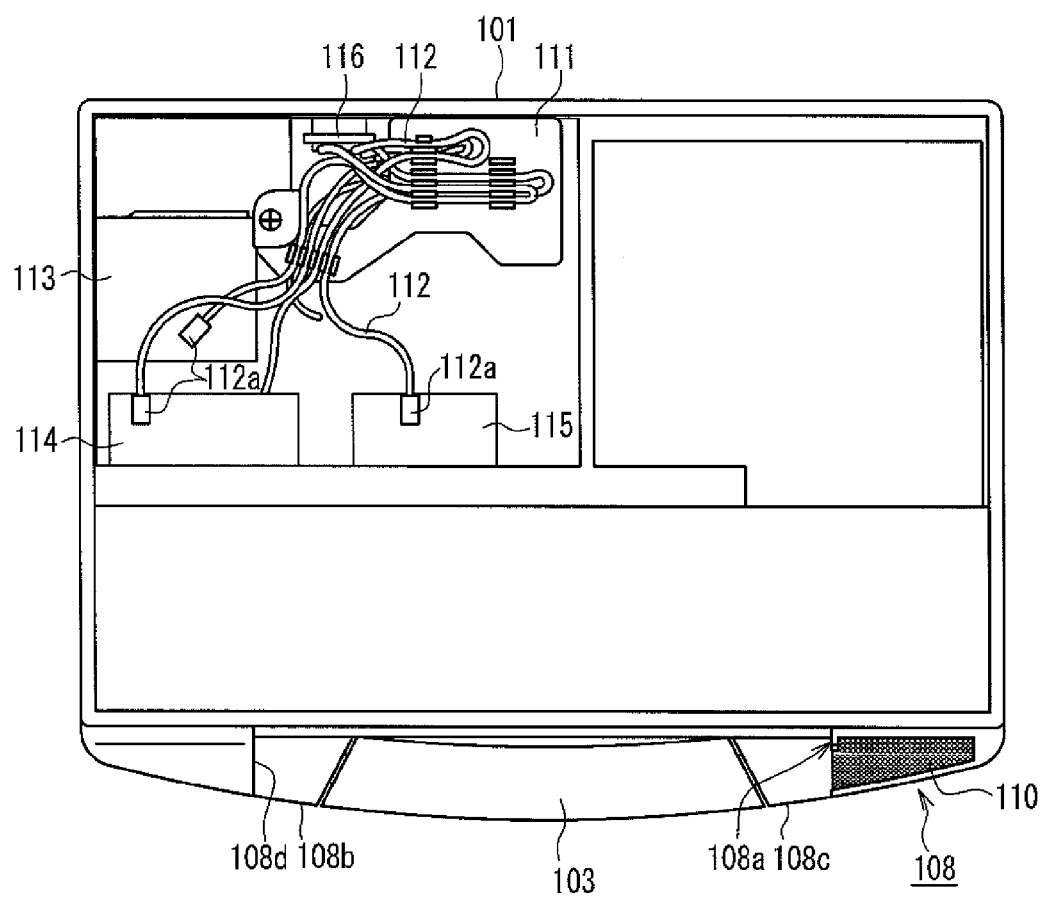
FIG. 10 is a plan view schematically illustrating an internal structure of the notebook computer in a state of FIG. 9.

FIG. 10 is a plan view illustrating a state in which a portion (main body bottom surface 101b) covering the reverse surface of the main housing 101 is removed from the state of FIG. 9. FIG. 10 illustrates only characteristic portions of an inner structure of the notebook computer of the present embodiment, and the configuration of portions other than the characteristic portions are omitted. More specifically, the present embodiment is characterized by a structure for wiring of relay cables 112 due to the cable holder 111 placed in the main housing 101. Therefore, FIG. 10 illustrates merely elements related to the function of the cable holder 111.

The main housing 101 includes the cable holder 111, the relay cables 112, a plurality of kinds of communication modules 113 to 115, and a terminal plate 116. Although FIG. 10 illustrates a notebook computer equipped with three kinds of communication modules, communication modules that are not shown also are mounted in the main housing 101. The relay cables 112 include a plurality of cables for connection to the internal antennas 109, connection to external antennas, etc. The terminal plate 116 is placed at a position close to the cable holder 111. On the terminal plate 116, connection terminals for connection to the internal antennas 109, connection terminals for connection to the external antennas, and the like are provided. Respective one ends of the relay cables 112 are connected to the connection terminals of the terminal plate 116. Connectors 112a are provided at the respective other ends of the relay cables 112. The connectors 112a are connected to the communication modules 113 to 115, etc.

Figure 11:
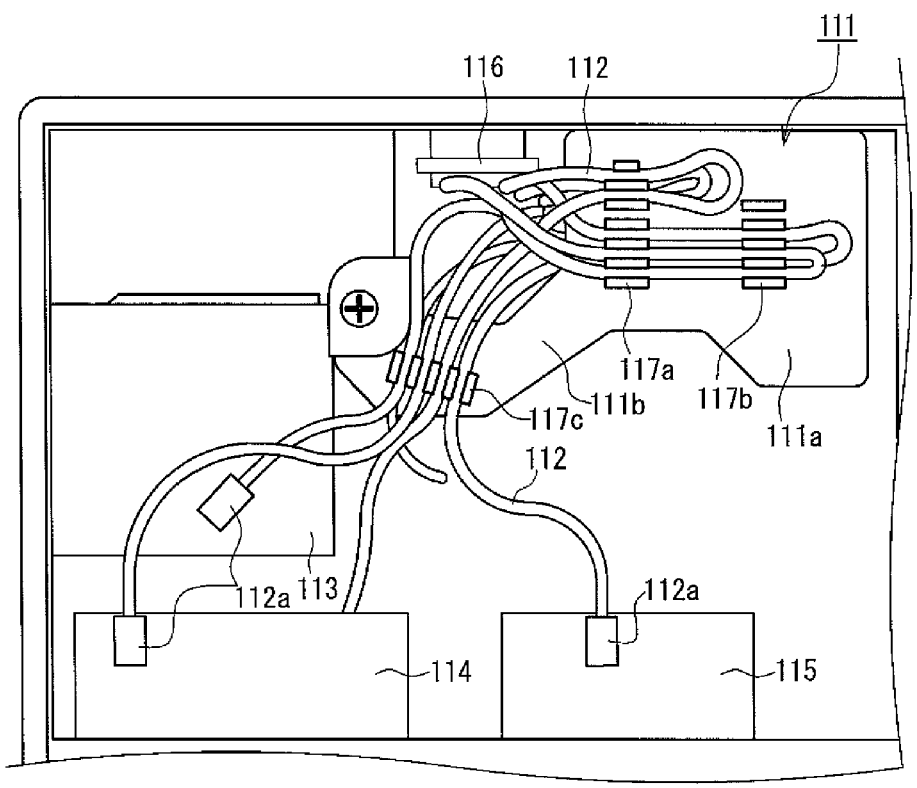
FIG. 11 is a plan view illustrating, in an enlarged state, a wiring portion with respect to communication modules of the notebook computer illustrated in FIG. 10.
Figure 12:
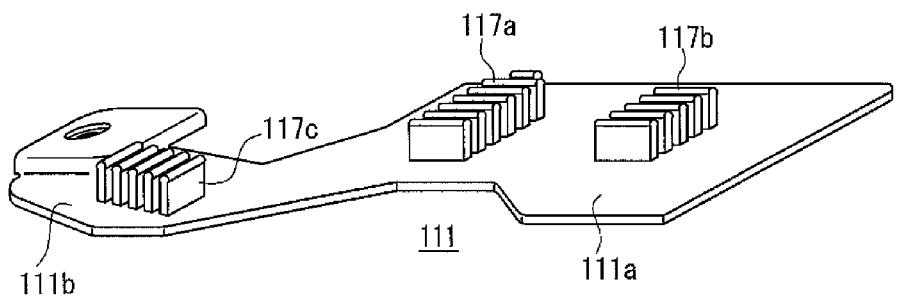
FIG. 12 is a perspective view of a cable holder for wiring illustrated in FIG. 11.

FIG. 11 is a plan view of a region where the cable holder 111 is provided. FIG. 12 is a perspective view of the cable holder 111. The cable holder 111 has a main holding portion 111a and an auxiliary holding portion 111b. The main holding portion 111a and the auxiliary holding portion 111b respectively are provided with a plurality of pinching pieces 117a to 117c. The pinching pieces 117a to 117c respectively have a plate shape. The plurality of pinching pieces 117a is placed at an equal interval. The plurality of pinching pieces 117b is placed at an equal interval. The plurality of pinching pieces 117c is placed at an equal interval. The relay cables 112 can be inserted between the adjacent pinching pieces 117a of the plurality of pinching pieces 117a, and thus, the pinching pieces 117a are allowed to hold the relay cables 112. The relay cables 112 can be inserted between the adjacent pinching pieces 117b of the plurality of pinching pieces 117b, and thus, the pinching pieces 117b are allowed to hold the relay cables 112. The relay cables 112 can be inserted between the adjacent pinching pieces of the plurality of pinching pieces 117c, and thus, the pinching pieces 117c are allowed to hold the relay cables 112. In the present embodiment, the outer diameters of the plurality of relay cables 112 are identical. Therefore, the relay cables 112 held respectively by the pinching pieces 117a to 117c are placed at an equal interval. The interval of the plurality of pinching pieces 117a, the interval of the plurality of pinching pieces 117b, and the interval of the plurality of pinching pieces 117c can be determined appropriately depending upon the outer diameter of the relay cables 112 to be pinched. The pinching pieces 117a and 117b are an example of "a pair of holding portions".

Figure 13:
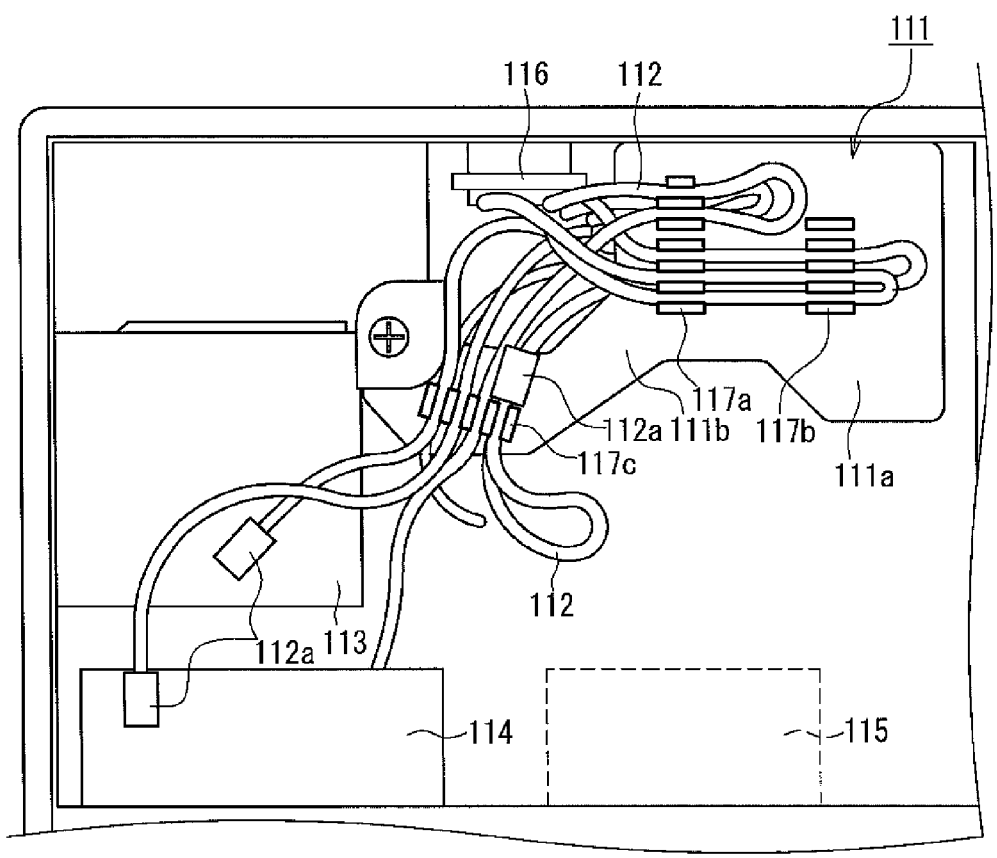
FIG. 13 is a plan view of another embodiment of the wiring illustrated in FIG. 11.

Further, as illustrated in FIG. 12, the height of the pinching pieces 117a to 117c preferably is set to be larger than the outer diameter of the relay cables 112. This is advantageous for wiring in the case where at least one of the communication modules 113 to 115 is omitted (in the case where not all the communication modules are mounted due to a user's desire, regional request, etc.), for example, as illustrated in FIG. 13. More specifically, the communication module 115 is omitted in the notebook computer illustrated in FIG. 13 (indicated by a broken line in FIG. 13), and when a portion in the vicinity of the connector 112*a* of the relay cable 112 to be connected to the omitted communication module 115 is left, the connector 112*a* will swing freely. When the connector 112*a* swings freely, the connector 112*a* may come into contact with, for example, a conductive portion to cause a short-circuit. In the present embodiment, even when at least any one of the communication modules 113 to 115 is omitted, the relay cables 112 are held by the pinching pieces 117*a* to 117*c*, which can prevent the connector 112*a* from coming into contact with, for example, a conductive portion. The height of the pinching pieces 117*a* corresponds to the height from the plate surface of the main holding portion 111*a* to the tip end of the pinching pieces 117*a*. The height of the pinching pieces 117*b* corresponds to the height from the plate surface of the main holding portion 111*a* to the tip end of the pinching pieces 117*b*. The height of the pinching pieces 117*c* corresponds to the height from the plate surface of the auxiliary holding portion 111*b* to the tip end of the pinching pieces 117*c*.

In this case, the vicinity of the connector 112*a* of the relay cables 112 can be held as illustrated in FIG. 13. In the wiring illustrated in FIG. 13, the vicinity of the connector 112*a* of the relay cable 112 is folded and superimposed on said relay cable 112 pinched by the pinching pieces 117*c* to be pinched by the pinching pieces 117*c*. This can prevent the vicinity of the connector 112*a* of the relay cables 112 from swinging, and suppress the occurrence of a short-circuit caused by the free swing of the connector 112*a* portion. The vicinity of the connector 112*a* of the relay cable 112 may be pinched by the pinching pieces 117*a* and 117*b*, or may be superimposed on another relay cable 112.

The internal antennas 109 can be used by a plurality of kinds of electronic function modules. One end of one relay cable 112 is connected to the connection terminal with respect to the internal antenna 109 provided on the terminal plate 116. The other end of said relay cable 112 is connected to any of the plurality of kinds of communication modules 113 to 115, etc. Further, one end of another relay cable 112 is connected to the connection terminal with respect to the outer antenna provided on the terminal plate 116. The other end of said relay cable 112 is connected to any of the plurality of kinds of communication modules.

The relay cable 112 for connection to the internal antenna is adjusted so as to have a length capable of selectively connecting the connection terminal with respect to the internal antenna to the plurality of kinds of communication modules 113 to 115, etc. The relay cable 112 for connection to the external antenna is similarly adjusted so as to have a length capable of selectively connecting the connection terminal with respect to the external antenna to the plurality of kinds of communication modules 113 to 115, etc. More specifically, the relay cable 112 has a length reaching the communication module to be connected, placed at a position farthest from the connection terminal with respect to the antenna.

Thus, in the case of connecting the connection terminal with respect to the antenna to the communication module closer to the connection terminal, an excess length is caused in the relay cable 112. Such an excess portion of the relay cable 112 can be held by the pinching pieces 117*a*, 117*b*. It is preferred that the pinching pieces 117*a* hold an excess portion of the relay cable 112 when the excess portion of the relay cable 112 is short. It is preferred that the pinching pieces 117*b* hold an excess portion of the relay cable 112 when the excess portion of the relay cable 112 is long. The pinching pieces 117*a* can hold an excess portion of the relay cable 112 even when the excess portion of the relay cable 112 is long. More specifically, when an excess portion of the relay cable 112 is long, the pinching pieces 117*a* and 117*b* are allowed to hold the excess portion of the relay cable 112, and when an excess portion of the relay cable 112 is short, the pinching pieces 117*a* are allowed to hold the excess portion of the relay cable 112.

Further, it is preferred that the relay cable 112 of a portion directed from the main holding portion 111*a* to each communication module is held by the pinching pieces 117*c* of the auxiliary holding portion 111*b*. Thus, the position of the relay cable 112 in a portion directed to each communication module is stabilized.

As described above, by allowing the cable holder 111 placed at a predetermined position to hold an excess portion of the relay cable 112, the excess portion is positioned at a predetermined place. Thus, the relay cable 112 having a length corresponding to the placement of a communication module to be connected does not need to be prepared, and hence, assembly workability is enhanced. Further, noise characteristics between the connection terminal of the internal antenna, the external antenna, etc. and the communication module are stabilized, and hence, processing by a circuit becomes easy. Further, a short-circuit and the like caused by the contact of the relay cable 112 with another conductive portion, etc. can be prevented.

In the above-mentioned configuration, the case has been described where wiring for connection to the internal antenna 109 and connection to the external antenna is performed. However, even in the case of wiring for only the connection to the internal antenna 109, practical effects are obtained sufficiently.

In the present embodiment, the notebook computer has been described as an example of electronic equipment. However, even when the construction of the present invention is applied similarly to various electronic equipment, similar effects can be obtained. Further, the present invention is not limited to the connection between a communication module and an antenna, and even when the construction of the present invention is applied similarly to electronic equipment having a configuration in which a plurality of kinds of electronic function modules are connected selectively to internal electronic elements that can be used by the electronic function modules via relay cables, in addition to a communication module being connected to an antenna, similar effects can be obtained.

Further, as long as a plurality of electronic function modules are mounted, the effects of the present invention can be obtained appropriately irrespective of the number of the electronic function modules. Further, the connection form between the electronic function modules and the internal electronic elements is not limited to the above-mentioned embodiment. More specifically, the effects of the present invention can be obtained as long as a relay cable is connected selectively, and an excess length varies depending upon the connection form thereof.

According to the electronic equipment disclosed by the present invention, an excess portion of a relay cable is positioned at a predetermined place, and noise characteristics between a connection terminal of an internal electronic element such as an antenna and an electronic function module such as a communication module is stabilized, which is useful for a notebook computer, etc.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. Electronic equipment, comprising:
    a first housing defining an interior, comprising first and second ends, a user input, and an upper surface that extends between the first and second ends, an opening permitting communication with the interior space and accessible from the upper surface being provided at the first end area;
    a circuit board in the interior of the first housing;
    a plurality of electric elements mounted on the circuit board;
    a second housing defining an interior, rotatably mounted to the first housing at the first end;
    a display mounted in the second housing;
    an antenna wire provided in the interior of the second housing, extending partially around a periphery of the display, and connected to the circuit board via the opening in the first housing; and
    a seal member for the opening, permitting passage of the antenna wire through the opening, the seal member comprising a cover member and a member with elasticity having a slit provided between the cover member and the upper surface of the first housing, the cover member and the member with elasticity being substantially parallel to the upper surface of the first housing, wherein
    the seal member further comprises, on the upper surface, a cable holding member having a pair of first and second holding portions opposed to each other with the member with elasticity interposed, the first holding portion being arranged on an outside of the member with elasticity opposite the opening on the upper surface, and the second holding portion being arranged on the upper surface between the member with elasticity and the opening, and
    the first and second holding portions and the slit linearly fix the antenna wire.

2. The electronic equipment of claim 1, wherein the second housing is rotatably mounted to the first housing with a hinge, and the antenna wire exits the second housing in the vicinity of the hinge.

3. The electronic equipment according to claim 1, wherein the antenna wire extends toward one side of the opening from directions corresponding to outsides of the opening, and passes the opening.

4. The electronic equipment according to claim 1, further comprising an upper seal member placed on an upper surface of the member with elasticity so as to abut on a portion of the member with elasticity positioned on a periphery of the opening.

5. The electronic equipment according to claim 4, wherein the upper seal member is large enough to cover an upper portion of the first holding portion of the cable holding member arranged on an outside of the member with elasticity.

6. The electronic equipment according to claim 1, wherein the antenna wire is buried in the slit formed in the member with elasticity while deforming the member with elasticity.

7. The electronic equipment according to claim 1, wherein a plurality of the antenna wires are present,
    each of the first and second cable holding portions fixes the plurality of the antenna wires, and
    the member with elasticity includes a plurality of slits capable of holding the plurality of the antenna wires in such a manner that the antenna wires are parallel to each other between the pair of first and second holding portions.

8. The electronic equipment according to claim 1, wherein a plurality of the antenna wires are present, and the antenna wires extend toward one side of the opening from two directions corresponding to both outsides of the opening, and pass the opening.

* * * * *